(12) United States Patent
O'Sullivan et al.

(10) Patent No.: US 7,252,774 B2
(45) Date of Patent: Aug. 7, 2007

(54) SELECTIVE CHEMICAL ETCH METHOD FOR MRAM SOFT LAYERS

(75) Inventors: Eugene J. O'Sullivan, Nyack, NY (US); David Abraham, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 611 days.

(21) Appl. No.: 11/147,512

(22) Filed: Jun. 8, 2005

(65) Prior Publication Data

US 2007/0012656 A1    Jan. 18, 2007

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................... 216/22; 216/57
(58) Field of Classification Search ............ 216/22, 216/57
See application file for complete search history.

(56) References Cited

U.S. PATENT DOCUMENTS

| | | | | |
|---|---|---|---|---|
| 6,426,012 B1 * | 7/2002 | O'Sullivan et al. | ............ | 216/22 |
| 6,656,372 B2 * | 12/2003 | Yates | ............ | 216/22 |
| 2006/0289381 A1 * | 12/2006 | O'Sullivan et al. | ............ | 216/22 |

* cited by examiner

*Primary Examiner*—Parviz Hassanzadeh
*Assistant Examiner*—Roberts Culbert
(74) *Attorney, Agent, or Firm*—Scully, Scott, Murphy & Presser, P.C.; Ido Tuchman, Esq.

(57) ABSTRACT

An etching process is employed to selectively pattern the exposed magnetic film layer of a magnetic thin film structure. The magnetic structure to be etched includes at least one bottom magnetic film layer and at least one top film layer which are separated by a tunnel barrier. The etching process employs various etching steps that selectively remove various layers of the magnetic thin film structure stopping on the tunnel barrier layer.

20 Claims, 3 Drawing Sheets

SELECTIVE CHEMICAL ETCH METHOD FOR MRAM SOFT LAYERS

This application was sponsored by the United States Government under Contract No. MDA 972-99-C-0009, which was awarded by the Defense Advanced Research Projects Agency (DARPA); therefore, the United States Government has certain rights and privileges in the present application.

FIELD OF THE INVENTION

The present invention relates to the processing of magnetic thin film structures, and in particular to an etching process for selectively etching exposed magnetic layers of a magnetic random access memory (MRAM) stack.

BACKGROUND OF THE INVENTION

MRAM has tremendous potential as a nonvolatile, solid-state memory to replace flash memory and electronically erasable programmable read-only memory (EEPROM). To enhance the performance of MRAM chips, it is necessary to reduce the lithographic minimum printable size. However, ion beam etching (IBE), a.k.a. ion milling, has been essentially the only method available for creating fine patterns, e.g., submicron patterns, in magnetic thin film structures. Because of the lack of volatile compounds for ferrous metals other than carbonyl, reactive-ion etching (RIE) has not been a viable technique for patterning thin magnetic films; and a RIE process based on carbonyl chemistry has not yet been developed. Thus, a chemical etching technique for patterning magnetic thin films based on Fe, Co and Ni is attractive because of the thin film nature of MRAM magnetic films (20–50 Å z-direction) relative to the x-y dimensions of patterned magnetic tunnel junction (MTJ) elements. The MRAM structure represents a complex multilayer system which includes numerous magnetic thin film layers. A typical MRAM structure is shown in FIG. 1. Specifically, the thin film structure shown in FIG. 1 comprises Si substrate 10, $SiO_x$ layer 12, a 150 Å Ti layer 14, $Ni_{81}Fe_{19}$ (40 Å) layer 16, $Ir_{20}Mn_{80}$ (120 Å) layer 18, $Co_{90}Fe_{10}$ (20 Å) layer 20, $Al_2O_3$ (10 Å) layer 22, $Ni_{81}Fe_{19}$ (40 Å) layer 24 and Ti (100 Å) layer 26. In this prior art magnetic structure, $Al_2O_3$ layer 22 serves as a tunnel barrier between the top magnetic film layer, i.e., $Ni_{81}Fe_{19}$ layer 24, and antiferromagnetic layer 18 and magnetic layers 16 and 20 which are present beneath the tunnel barrier layer. Layer 26 is a passivating layer that prevents moisture, air or other contaminants from entering into the structure, while layer 14 is an adhesion layer.

As is well known to those skilled in the art, the magnetic films of prior art MRAM structures, such as illustrated in FIG. 1, are quite thin. Patterning of the MRAM structure of FIG. 1 is typically carried out in the prior art by first applying a mask to the MRAM structure and patterning the mask by lithography (exposure and development). FIG. 2 shows the structure after these steps wherein reference number 28 represents the patterned mask. The pattern is then transferred to the MRAM structure by first removing the top 100 Å Ti film 26 of the MRAM structure by RIE, IBE, or wet etching. Next, the exposed $Ni_{81}Fe_{19}$ (40 Å) layer 24 can be pattern-wise etched by RIE, IBE, or wet etching. In a traditional wet etching process, a standard aqueous acid solution, such as sulfuric and/or nitric acid, is employed to etch the exposed $Ni_{81}Fe_{19}$ (40 Å) layer 24. Although the acid etchants are capable of etching through the exposed top magnetic layer 24 of the structure, the acid etchants are not selective for removing just that exposed magnetic layer 24. Instead, when the acid etchants are employed, they also etch the underlying alumina tunnel barrier layer 22, the $Co_{90}Fe_{10}$ layer 20, and some Mn in the $Ir_{20}Mn_{80}$ layer 18 providing the structure shown in FIG. 3.

Despite being capable of etching numerous magnetic layers in the MRAM structure, the use of prior art aqueous acid solutions causes Galvanic-coupling-accelerated dissolution of the $Co_{90}Fe_{10}$ (20 Å) 20 layer in the film region under the mask which is unacceptable for many applications. A desirable situation would be to etch through the top passivating layer 26 and the top exposed magnetic layer, i.e., layer 24, stopping at the thin $Al_2O_3$ layer 22, thereby leaving the underlying layers, i.e., layers 16, 18, and 20, unetched.

U.S. Pat. No. 6,426,012 describes a process of selectively etching the top magnetic layer of a magnetic structure stopping on the alumina tunnel barrier via the use of a dicarboxylic acid aqueous etchant solution. However, the acids employed in U.S. Pat. No. 6,426,012 are limited to weak acids which are subject to limited solubilities.

There is thus a need for developing another etching process which is capable of selectively etching the magnetic thin film structure so as to provide a patterned structure wherein the pattern is not formed in the tunnel barrier layer. Such an etch process would be beneficial since it would prevent unwanted Galvanic corrosion of the inner magnetic layers, while being able to pattern the top magnetic film layer and the tunnel barrier layer of the structure.

SUMMARY OF THE INVENTION

The present intention is directed to a method of selectively patterning the top magnetic film layer of a magnetic structure stopping on the tunnel barrier layer in which the various etching processes employed do not adversely damage the tunnel barrier layer and the magnetic thin film layers that are present beneath the tunnel barrier layer. The aforementioned object is achieved by utilizing a three-part selective etching process. Specifically, the above object is obtainable utilizing processing steps that include:

(a) providing a magnetic structure comprising at least one bottom magnetic film layer and at least one top magnetic film layer, wherein said at least one top and said at least one bottom magnetic film layers are separated by a tunnel barrier layer, and said at least one top magnetic film layer having a passivating layer located thereon;

(b) forming a patterned resist on said passivating layer, wherein a portion of said passivating layer is exposed;

(c) selectively etching said exposed portion of said passivating layer by a reactive-ion etching process to expose a portion of said at least one top magnetic film layer; and (d) selectively etching said exposed portion of said at least one top magnetic film layer by a wet etch process which includes an etchant solution comprising a surfactant inhibitor and at least one weakly adsorbing acid stopping on said tunnel barrier layer.

DESCRIPTION OF THE INVENTION

Figure 1:
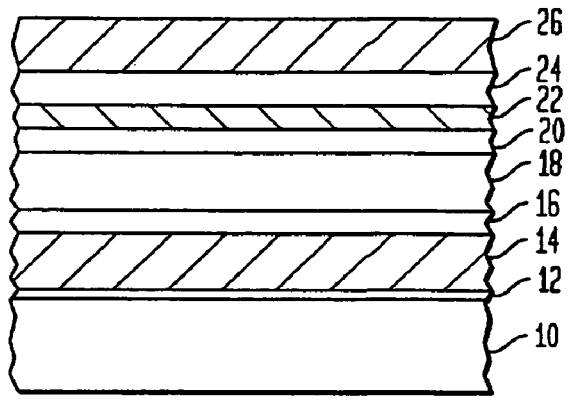
FIGS. 1–3 are pictorial views through cross-sections illustrating a typical prior art process of patterning a magnetic thin film structure.
Figure 2:
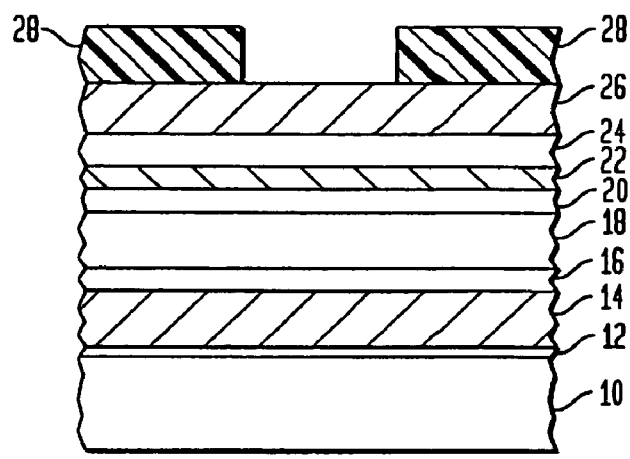
Figure 3:
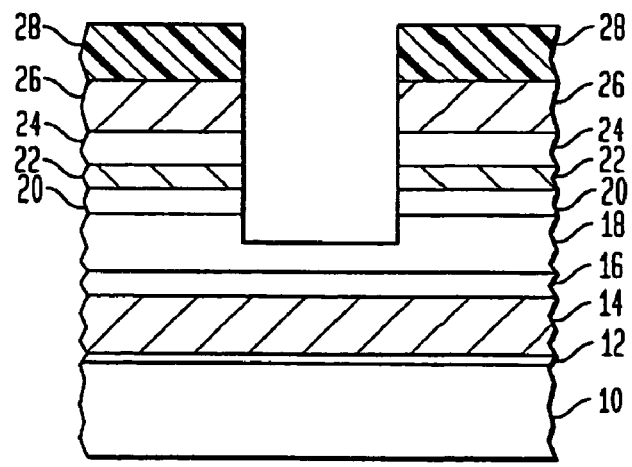

The present invention, which provides a method for selectively etching the exposed top magnetic layer of a magnetic thin film structure, without adversely affecting the tunnel barrier layer or the underlying magnetic thin film layers, will now be described in more detail by referring to the drawings that accompany the present application. It is noted that the drawings of the present invention are provided for illustrative purposes and thus they are not drawn to scale.

Figure 4:
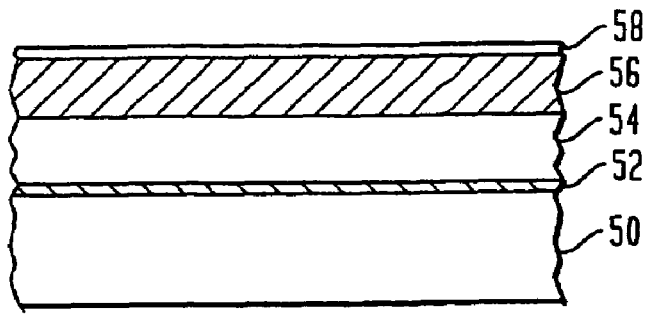
FIGS. 4–8 are pictorial views through cross-sections illustrating the basic processing steps of the present invention which are used in patterning a magnetic thin film structure.

Reference is first made to FIG. 4 which includes a portion of a magnetic thin film structure that can be utilized in the present invention. Specifically, the portion of the magnetic structure shown in FIG. 4 includes at least one bottom magnetic thin film layer 50 and at least one top magnetic film layer 54 which are separated by a tunnel barrier layer 52. The upper most surface layer of the at least one top magnetic layer 54 has a passivating layer 56 located thereon and the passivating layer includes a surface oxide 58. The portion of the magnetic thin film structure shown in FIG. 4 may further include a semiconductor substrate, a $SiO_x$ layer and a Ti layer, or other adhesion layers which would be located beneath the at least one bottom magnetic thin film layer 50. When these elements are present, the magnetic thin film structure would look similar to the one depicted in FIG. 1. For clarity, however, the material layers located beneath the layer 50 are not shown in FIGS. 4-8.

The portion of the magnetic thin film structure illustrated in FIG. 4 is formed utilizing conventional techniques well known in the art that are capable of forming such a structure. For example, the various magnetic and non-magnetic layers may be formed by utilizing the same or different deposition process including, for example, chemical vapor deposition (CVD), plasma-assisted CVD, plating, evaporation, sputtering, chemical solution deposition and other like deposition processes.

The top and bottom magnetic film layers (54 and 50, respectively) of the illustrated structure may be composed of the same or different magnetic layers in which each individual layer has a thickness of less than 150 Å. Preferably, each individual magnetic film layer (50 or 54) has a thickness of less than 100 Å.

Illustrative examples of magnetic films that can be employed in the present invention include, but are not limited to: $Ni_xFe_y$, $Ni_xCo_yFe_z$, and other like magnetic films. In the above formulas, x, y, and z are any integers whose sum adds up to 100. In accordance with the present invention, the bottom magnetic film layer 50 as well as the top magnetic film layer 54 may comprise only one magnetic film or they may comprise a stack of magnetic films.

In one embodiment of the present invention, the top magnetic film layer 54 is comprised of a Permalloy layer, i.e., a $Ni_xFe_y$ type, or $Co_xFe_y$ layer, while the bottom magnetic film layer 50 comprises a stack consisting of $Ni_xFe_y$ and $Co_xFe_y$.

In one embodiment of the present invention, any exposed edge of the magnetic structure may be coated with a conventional passivating material so as to prevent certain underlying films, notably the noble metal containing exchange bias layer, from engaging in Galvanic type reactions that could inhibit the etching process.

The tunnel barrier layer 52 employed in the present invention includes any conventional material layer such as $Al_2O_3$ which is capable of sustaining a tunneling current and which does not chemically degrade the properties of the top and bottom magnetic layers (54 and 50, respectively). In some instances, the tunnel barrier layer 52 may also serve as a diffusion barrier. The tunnel barrier layer 52 employed in the present invention is a thin layer which has a thickness less than about 15 Å.

The passivating layer 56 employed in the present invention includes any metal layer such as, for example, Ti, TiN, Ta, or TaN which serves as a barrier layer preventing diffusion of moisture, air and other contaminants from contacting with the underlying magnetic layers and the tunnel barrier layer. The thickness of this layer may vary, but typically the passivating layer 56 has a thickness of from about 20 to about 1000 Å.

As indicated above, the passivating layer 56 contains a surface oxide 58 which is located on the upper surface of the passivating layer 56 when the structure is exposed to air.

Figure 5:
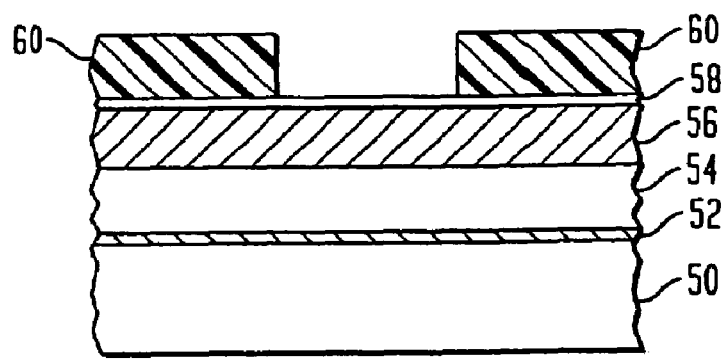
Figure 6:
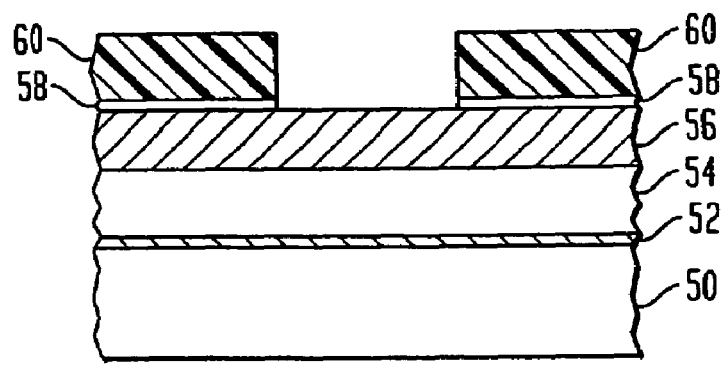
Figure 7:
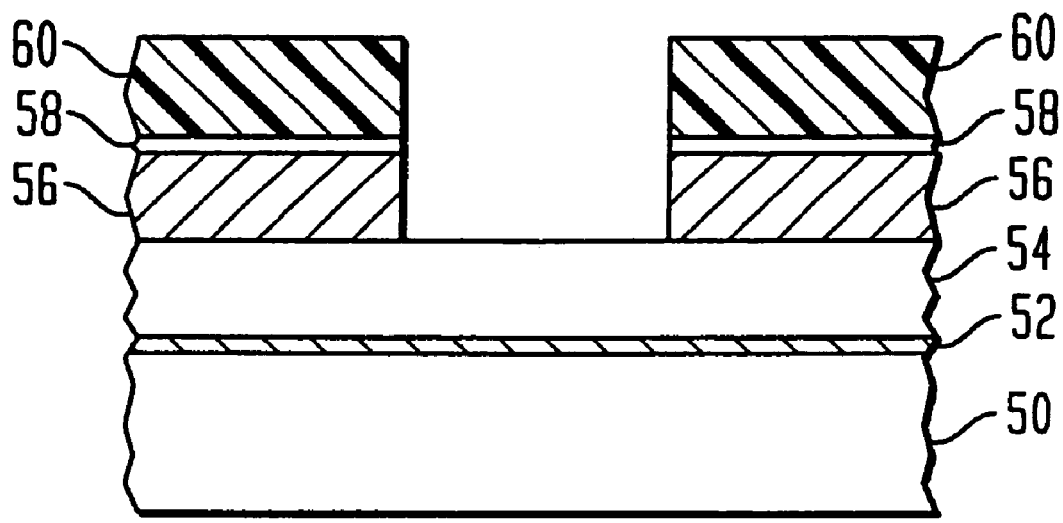

Next, and as illustrated in FIG. 5, patterned resist 60 is formed on the surface of the surface oxide 58 of the passivating layer 56 utilizing conventional lithography. Specifically, the lithography process includes: (i) applying a conventional resist to the surface oxide 58 of the passivating layer 56 via a conventional deposition process such as spin-on coating, dip coating, CVD, plasma-assisted CVD, evaporation and chemical solution deposition; (ii) exposing the resist to radiation to form a desired pattern therein; and (III) developing the desired pattern using a conventional developer solution to expose a portion of the surface oxide 58 that is located on the upper surface of the passivating layer 56.

Following the formation of the patterned resist, the inventive etching process, which will be described in more detail below, is performed. First, the exposed portion of the surface oxide 58 is removed by utilizing a reactive-ion etching (RIE) process providing the structure shown FIG. 6. The RIE process may include $CF_4$/Ar or $CBrF_3$/$SF_6$ as etchant gases. Any suitable RIE process may be used, such as the process disclosed in U.S. Pat. No. 6,426,012; the entire content of which is incorporated herein by reference. Those skilled in the art can ascertain the suitable conditions without undue experiments.

In one embodiment of the present invention, an optional oxygen ashing process is performed prior to removing the exposed surface oxide 58. The optional oxygen ashing process includes the use of oxygen ashing conditions well known to those skilled in the art that are capable of removing any etched resist residue from the exposed surface of the surface oxide 58 of the passivating layer 56. In another embodiment of the present invention, a conventional oxygen ashing process which is capable of removing any fluorine-related resist residue may be performed after conducting the above described RIE step.

Next, the exposed portion of the passivating layer 56 that does not include any inert surface oxide layer 58 is subjected to a suitable etching process that includes the use of RIE. Any suitable etching process may be used, such as the etching process disclosed in U.S. Pat. No. 6,426,012. Those skilled in the art can ascertain the suitable conditions without undue experiments. In this step of the present invention, the passivating layer 56 is selectively patterned to expose a portion of the at least one top magnetic film layer 54, See FIG. 7.

Alternatively, and when a Ta (or TaN) passivating layer 56 is employed, the above wet etching step may be replaced with a $SF_6$ RIE plasma etching process. The use of $SF_6$ RIE plasma etching to remove the Ta (or TaN) passivating layer 56 also modifies the surface of the exposed magnetic layer 54 to include sulfur. Alternatively, another RIE etchant gas which removes Ta (or TaN) could be used first and thereafter the etched surface is treated with a $SF_6$ gas.

The presence of sulfur on the magnetic thin film layer 54 is advantageous since sulfur-containing magnetic film layers 54 etch at a much faster rate than magnetic film layers which does not include sulfur fragments.

Figure 8:
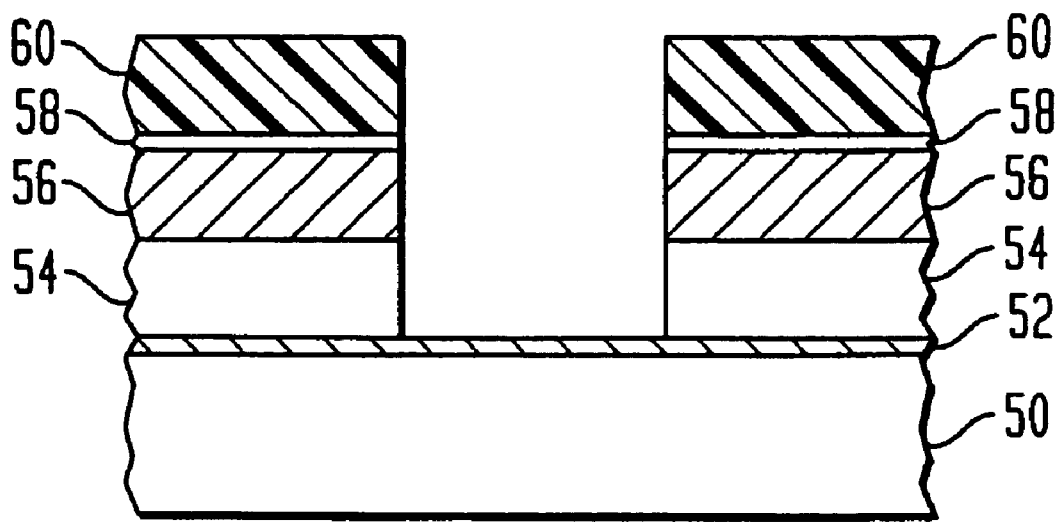

FIG. 8 shows the next step of the present invention in which exposed top magnetic layer 54 is selectively etched utilizing an etching process that is capable of stopping on the tunnel barrier layer 52. In this step of the present invention, the exposed top magnetic film layer 54 is selectively etched utilizing an etchant solution that comprises at least one weakly adsorbing acid and a surfactant inhibitor. The commonly used strong acids, such as sulfuric acid, interact too strongly with alumina causing undesirable dissolution. To avoid this problem, the acids employed in the inventive etchant solution are weakly adsorbing strong acids.

As indicated above, the etchant solution used in this step of the present invention includes at least two required components. The first of the required component is a weakly adsorbing acid. Preferred weakly adsorbing acids employed in the present invention are perfluoroalkane sulfonic acids, perfluoroalkane phosphonic acids, or perchloric acid. By "a perfluoroalkane sulfonic acid" it is meant a sulfonic acid derivative that is substituted with a perfluoroalkyl group. By "a perfluoroalkane phosphonic acid" it is meant a phosphonic acid derivative that is substituted with a perfluoroalkyl group. By "a perfluoroalkyl" it is meant an alkyl in which all hydrogen atoms have been replaced by fluorine. Preferred perfluoroalkane sulfonic acids employed in the present invention are $CF_3(CF_2)_nSO_3H$ or $(CF_2)_m(SO_3H)_2$, wherein n can be zero or any integer from 1 to 6, m can be any integer from 1 to 6, and the F atom can be optionally substituted by $-NH_2$. Illustrative examples of perfluoroalkane sulfonic acids that can be used in the present invention include, but are not limited to: $CF_3SO_3H$; $CF_3CF_2SO_3H$; $CF_2(SO_3H)_2$; $(CF_2)_2(SO_3H)_2$; and other analogous perfluoroalkan sulfonic acids with perfluoroalkyl chains having more than two carbon atoms Other suitable perfluoroalkane sulfonic acids include analogs of the above illustrative examples wherein at least one of the F atom are substituted by $-NH_2$. Preferred perfluoroalkane phosphonic acids employed in the present invention are $CF_3(CF_2)_nPO_3H_2$ or $(CF_2)_m(PO_3H_2)_2$, wherein n can be zero or any integer from 1 to 6, m can be any integer from 1 to 6, and the F atom can be optionally substituted by $-NH_2$. Illustrative examples of perfluoroalkane phosphonic acids that can be used in the present invention include, but are not limited to: $CF_3PO_3H_2$; $CF_3CF_2PO_3H_2$; $CF_2(PO_3H_2)_2$; $(CF_2)_2(PO_3H_2)_2$; and other analogus perfluoroalkane sulfonic acids with perfluoroalkyl chains having more than two carbon atoms. Other suitable perfluoroalkane phosphonic acids include analogs of the above illustrative examples wherein at least one of the F atom are substituted by $-NH_2$. It is understood to one skilled in the art that the sulfonic acid group of the above perfluoroalkane sulfonic acids and the phosphonic acid group of the above perfluoroalkane phosphonic acids can be at any position in the perfluoroalkyl chain.

The second required component to the etchant solution is a surfactant inhibitor. The term "surfactant inhibitor" is used herein to denote a substance that, when present at a low concentration, adsorbs onto the surface of a solution or the interfaces of a multi-phase solution system, and substantially alters the free energy of the surface or the interfaces. The term "interface" is used herein to denote a surface forming a common boundary between any two immiscible phases. Preferred surfactant inhibitors are selected from long-chain alkylsulfonic acid salts, long-chain alkylcarboxylic acid salts, long-chain perfluoroalkylsufonic acid salts, long-chain perfluoroalkylcarboxylic acid salts and other analogous compounds. By "long-chain alkylsulfonic acid salts" it is meant any metal salt of sulfonic acid derivatives that are substituted with long-chain alkyl groups. By "long-chain alkylcarboxylic acid salts" it is meant any metal salt of carboxylic acid derivatives that are substituted with long-chain alkyl groups. By "long-chain alkyl" it is meant an acyclic alkyl that has more than 6 carbon atoms. Illustrative examples of surfactant inhibitors that can be employed in the present invention include, but are not limited to: $CH_3(CH_2)_hSO_3M$; $CH_3(CH_2)_hCO_2M$; $CF_3(CF_2)_h SO_3M$; $CF_3(CF_2)_hCO_2M$; and other analogous compounds; wherein M may be any metal cation, such as a sodium or potassium cation, and h can be any integer from 8 to 16. It is understood to one skilled in the art that the alkyl chain of the above illustrative examples can be straight or branched. The most preferred surfactant inhibitors are $CH_3(CH_2)_h SO_3Na$ wherein h can be any integer from 8 to 16. Since the pH of zero charge (PZC) of bulk alumina is close to 9, the PCZ of the tunnel barrier 52 should be significantly greater than the pH of the inventive etchant solutions. The negatively charged $SO_3^-$ group of the long-chain alkylsulfonic acid salts adsorbs on the positively charged sites on the tunnel barrier surface thereby protecting the tunnel barrier 52 from dissolution, or significantly slowing such dissolution. The longer the chain length of the surfactant inhibitor, the greater is the thermodynamic tendency for the surfactant inhibitor to come out of solution and adsorb on surfaces.

The inventive etchant solution typically comprises a surfactant inhibitor at a concentration of at least about $5 \times 10^{-6}$ molar, with a preferred concentration being dependent on the solubility of the surfactant inhibitor. For example, the preferred concentration for sodium tetradecanesulfonate is from about $2 \times 10^{-5}$ to about $10^{-4}$ molar.

The inventive etchant solution typically comprises a sulfonic acid at a concentration of from about $10^{-3}$ molar to about 1.0 molar, with a concentration from about $5 \times 10^{-3}$ molar to about $5 \times 10^{-2}$ molar being more preferred.

The inventive etchant solution typically comprises a phosphonic acid at a concentration of from about $10^{-3}$ molar to about 1.0 molar, with a concentration from about $5 \times 10^{-3}$ molar to about $5 \times 10^{-2}$ molar being more preferred.

The inventive etchant solution typically comprises perchloric acid at a concentration of from about $10^{-3}$ molar to about 1.0 molar, with a concentration from about $5 \times 10^{-3}$ molar to about $5 \times 10^{-2}$ molar being more preferred.

It is observed that in this step of the present invention, this etching step produces desirable results as long as the concentrations of the surfactant inhibitor and the at least one weakly adsorbing acid are within the above mentioned range.

This etching step is typically carried out at a temperature of about 15° C. to about 50° C. for a period of time from about 0.5 to about 15 minutes, depending on the source and type of parts, the condition of the free top layer surface, and the thickness of the top magnetic layer 54. More preferably, the etching step is carried out at a temperature of about 20° C. to about 35° C. Due to the limited solubility of long-chain alkylsulfonic acid salts in aqueous solution, it is preferred to employ good agitation in this etching step to ensure efficient transport of the surfactant inhibitor to the surface.

Following the third etching step of the present invention, the patterned structure may be rinsed with a suitable inert solvent or supercritical fluid and the patterned resist may then be stripped utilizing any well known stripping process. The patterned magnetic structure may then be subjected to conventional MRAM processing techniques also well known to those skilled in the art.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but all within the scope of the appended claims.

The invention claimed is:

1. A method of selectively patterning a magnetic film structure comprising the steps of:
   (a) providing a magnetic structure comprising at least one bottom magnetic film layer and at least one top magnetic film layer, wherein said at least one top and said at least one bottom magnetic film layers are separated by a tunnel barrier layer, and said at least one top magnetic film layer having a passivating layer located thereon;
   (b) forming a patterned resist on said passivating layer, wherein a portion of said passivating layer is exposed;
   (c) selectively etching said exposed portion of said passivating layer by a reactive-ion etching process to expose a portion of said at least one top magnetic film layer; and
   (d) selectively etching said exposed portion of said at least one top magnetic film layer by a wet etch process which includes an etchant solution comprising a surfactant inhibitor and at least one weakly adsorbing acid stopping on said tunnel barrier layer.

2. The method of claim 1 wherein said at least one top magnetic film layer and said at least one bottom magnetic film layer are the same or different, and are $Ni_xFe_y$, $Ni_xCo_y$-$Fe_z$, wherein x, y and z are any integers whose sum adds up to 100.

3. The method of claim 1 wherein said at least one top magnetic layer is $Ni_xFe_y$ and the at least one bottom magnetic film layer is a stack comprising $Ni_xFe_y$ and $Co_xFe_y$.

4. The method of claim 1 wherein said passivating layer is one of Ti, Ta, TiN or TaN.

5. The method of claim 1 wherein said tunnel barrier layer is $Al_2O_3$.

6. The method of claim 1 wherein each magnetic film layer has a thickness of less than 150 Å.

7. The method of claim 1 wherein said patterned resist is formed by applying a resist, exposing the resist to a pattern of radiation and developing the pattern.

8. The method of claim 1 wherein said surfactant inhibitor employed in step (d) is an alkylsulfonic acid salt.

9. The method of claim 1 wherein said surfactant inhibitor employed in step (d) is $CH_3(CH_2)_nSO_3Na$, wherein n is an integer from 8 to 16.

10. The method of claim 1 wherein the concentration of said surfactant inhibitor is at least about $5\times10^{-6}$ molar.

11. The method of claim 1 wherein step (d) is performed at a temperature from about 15° C. to about 50° C. for a time period from about 0.5 to about 15 minutes.

12. The method of claim 1 wherein said reactive-ion etching process in step (c) is $SF_6$ RIE plasma etching process.

13. The method of claim 1 wherein said at least one weakly adsorbing acid employed in step (d) is perfluoroalkane sulfonic acid, perfluoroalkane phosphonic acid, or perchloric acid.

14. The method of claim 13 wherein said perfluoroalkane sulfonic acid is $CF_3(CF_2)_nSO_3H$ or $(CF_2)_m(SO_3H)_2$, wherein n is zero or an integer from 1 to 6, m is an integer from 1 to 6, and the F atom can be optionally substituted by $-NH_2$ group.

15. The method of claim 13 wherein said perfluoroalkane phosphonic acid is $CF_3(CF_2)_nPO_3H_2$ or $(CF_2)_m(PO_3H_2)_2$, wherein n is zero or an integer from 1 to 6, m is an integer from 1 to 6, and the F atom can be optionally substituted by $-NH_2$ group.

16. The method of claim 1 wherein the concentration of said perfluoroalkane sulfonic acid is from about $10^{-3}$ molar to about 1.0 molar.

17. The method of claim 1 wherein the concentration of said perfluoroalkane sulfonic acid is from about $5\times10^{-3}$ molar to about $5\times10^{-2}$ molar.

18. The method of claim 1 wherein the concentration of said perfluoroalkane phosphonic acid is from about $10^{-3}$ molar to about 1.0 molar.

19. The method of claim 1 wherein the concentration of said perfluoroalkane phosphonic acid is from about $5\times10^{-3}$ molar to about $5\times10^{-2}$ molar.

20. The method of claim 1 wherein the concentration of said perchloric acid is from about $10^{-3}$ molar to about 1.0 molar.

* * * * *